(12) United States Patent
Derasmo et al.

(10) Patent No.: US 11,276,948 B2
(45) Date of Patent: Mar. 15, 2022

(54) INTEGRATED CONNECTOR INSULATOR FOR POWER SUPPLY MODULES

(71) Applicant: North Atlantic Industries, Inc., Bohemia, NY (US)

(72) Inventors: Vito Derasmo, Wantagh, NY (US); Adrian Alexandru Siu, Port Jefferson, NY (US)

(73) Assignee: North Atlantic Industries, Inc., Bohemia, NY (US)

(*) Notice: Subject to any disclaimer, the term of this patent is extended or adjusted under 35 U.S.C. 154(b) by 173 days.

(21) Appl. No.: 15/929,801

(22) Filed: May 22, 2020

(65) Prior Publication Data

US 2020/0373695 A1 Nov. 26, 2020

Related U.S. Application Data

(60) Provisional application No. 62/852,675, filed on May 24, 2019.

(51) Int. Cl.
| | | |
|---|---|---|
| *H01R 12/71* | (2011.01) | |
| *H05K 5/00* | (2006.01) | |
| *H01R 13/533* | (2006.01) | |
| *H01R 13/53* | (2006.01) | |
| *H05K 5/03* | (2006.01) | |

(52) U.S. Cl.
CPC .......... *H01R 12/716* (2013.01); *H01R 13/53* (2013.01); *H01R 13/533* (2013.01); *H05K 5/0026* (2013.01); *H05K 5/03* (2013.01)

(58) Field of Classification Search
CPC ...... H05K 5/0026; H05K 5/03; H01R 12/716; H01R 13/533
See application file for complete search history.

(56) References Cited

U.S. PATENT DOCUMENTS

| 5,292,256 | A | * | 3/1994 | Brunker | ............... | H01R 12/724 |
| | | | | | | 439/108 |
| 5,395,249 | A | * | 3/1995 | Reynolds | ........... | H01R 13/2471 |
| | | | | | | 439/65 |
| 5,770,928 | A | * | 6/1998 | Chansky | ................ | H05B 47/18 |
| | | | | | | 315/362 |
| 2002/0137373 | A1 | * | 9/2002 | Billman | ............... | H01R 13/514 |
| | | | | | | 439/108 |
| 2017/0207579 | A1 | * | 7/2017 | Patel | .................. | H01R 13/6473 |

OTHER PUBLICATIONS

VPX57-31 3U VPX DC/DC Converter Specification Sheet, North Atlantic Industries, Inc., Rev H, p. 12, Dec. 2018.
North Atlantic Industries, Inc. Change Order, Purchase Order 10230775 dated Mar. 6, 2019.
North Atlantic Industries, Inc. Purchase Order 4104102372 dated May 7, 2019.

* cited by examiner

*Primary Examiner* — Jean F Duverne
(74) *Attorney, Agent, or Firm* — Sutton Magidoff Barkume LLP

(57) ABSTRACT

An integrated insulator having a body adapted for placement in proximity to a module connector, and at least one fin extending from the body so as to extend through a connector slot on the module connector and reside in a gap between a pair of contacts when the integrated insulator is engaged with the module connector.

7 Claims, 5 Drawing Sheets

INTEGRATED CONNECTOR INSULATOR FOR POWER SUPPLY MODULES

TECHNICAL FIELD

This invention relates generally to an electrical connector for printed circuit boards and modules, and in particular to an integrated insulator for electrical connectors that provides increased creepage and clearance in high voltage, high altitude environments.

BACKGROUND OF THE INVENTION

Electronic modules such as power supply modules may be used in harsh environments such as high altitudes, for example in avionics applications. In particular, when a power supply module operates to provide high voltages, such as in the range of 270-350 VDC, problems arise at high altitudes since air at such high altitudes is more conductive than at lower altitudes. That is, in high altitude environments, a high voltage across adjacent contacts at the module connector may cause problems such as arcing across the contacts. Ideally, an increase in creepage and clearance between the contacts would be designed into the system by placing the contacts farther apart from each other. Creepage refers to the shortest path between two conductive parts (or between a conductive part and the bounding surface of the equipment) measured along the surface of the insulation. The parameters for pad-to-pad, pad-to-trace, trace-to-trace spacing—basically any spacing rule that is applied between conductive elements over an insulating surface—is creepage, not clearance. Spacing between conductive elements through air is referred to as clearance.

Industry standards, however, often dictate the predetermined spacings that must exist between contacts in a module connector. Thus, in order to achieve the desired electrical isolation between adjacent connector contacts for high voltage applications at high altitudes, there is a need to increase the effective creepage and clearance between adjacent contacts on the connector without increasing the distance therebetween.

The VMEbus International Trade Association ("VITA") implements industry standards relevant to this field. The VITA 62.0 standard describes requirements for power supply modules, and VITA 62.2 is developing a 270-volt connector standard. VITA 62.2 suggests the use of discrete spacers (sometimes referred to as fins) placed between adjacent contacts in order to address this need for increased creepage and clearance. However, this discrete spacer implementation has been shown to be problematic since they interfere with the existing module chassis and they do not, by themselves, address the lack of creepage introduced by the conductive chassis surface.

SUMMARY OF THE INVENTION

The present invention addresses this and other problems in the prior art in order to increase the effective creepage and clearance between adjacent contacts on a module connector without increasing the distance therebetween in order to operate effectively at high altitude, high voltage environments.

In one aspect of the invention, an integrated insulator is described having a body adapted for placement in proximity to a module connector, with at least one fin feature extending from the body so as to extend through a connector slot on the module connector and reside in a gap between a pair of adjacent contacts when the integrated insulator is engaged with the module connector, thus providing an increase in the effective creepage and clearance between the adjacent contacts. The fin feature of the integrated insulator performs the task of the separator while the main body replaces a portion of the chassis to extend the creepage path without requiring further insulation components or materials. This may be extended to any number of adjacent contacts. For example, three adjacent contacts may be separated from each other by a pair of fins that extend from the body of the integrated insulator and reside in the corresponding gaps between the adjacent contacts.

In another aspect of the invention, a combination module connector and integrated insulator is described, wherein the module connector has at least two contacts extending therefrom and separated from each other by a gap, and at least one connector slot disposed in the gap; and the integrated insulator has a body adapted for placement in proximity to the module connector, and at least one fin extending from the body so as to extend through the connector slot on the module connector and reside in the gap when the integrated insulator is engaged with the module connector. Again, this may be extended to any number of adjacent contacts, such as three adjacent contacts that are separated from each other by a pair of fins that extend from the body of the integrated insulator and reside in the corresponding gaps between the adjacent contacts.

In a further aspect of the invention, described is an electronic module, such as a power supply module, that has several main components including a housing, a printed circuit board, a module connector, and an integrated insulator. The housing has a primary side cover and a secondary side cover, wherein when the primary side cover and the secondary side cover are adjoined together a cavity is formed. The printed circuit board includes electrical circuitry such as power supply circuitry and is located substantially within the cavity in the housing. The module connector is affixed to the printed circuit board and includes three contacts extending therefrom and separated from each other by a first gap and a second gap. Each contact is electrically connected to the electrical circuitry on the printed circuit board for interfacing the electrical circuitry with a backplane when the module is plugged into the backplane. There is also a first connector slot disposed in the first gap and a second connector slot disposed in the second gap. The printed circuit board further has a first board slot disposed near the first connector slot and a second board slot disposed near the second connector slot when the module connector is affixed to the printed circuit board. The integrated insulator is engaged in proximity to the module connector, and has a body adapted for placement in proximity to the module connector, a first fin extending from the body and extending through the first connector slot on the module connector and the first board slot so as to reside in the first gap when the integrated insulator is engaged with the module connector, and a second fin extending from the body and extending through the second connector slot on the module connector and the second board slot so as to reside in the second gap when the integrated insulator is engaged with the module connector.

DETAILED DESCRIPTION OF THE INVENTION

Figure 1:
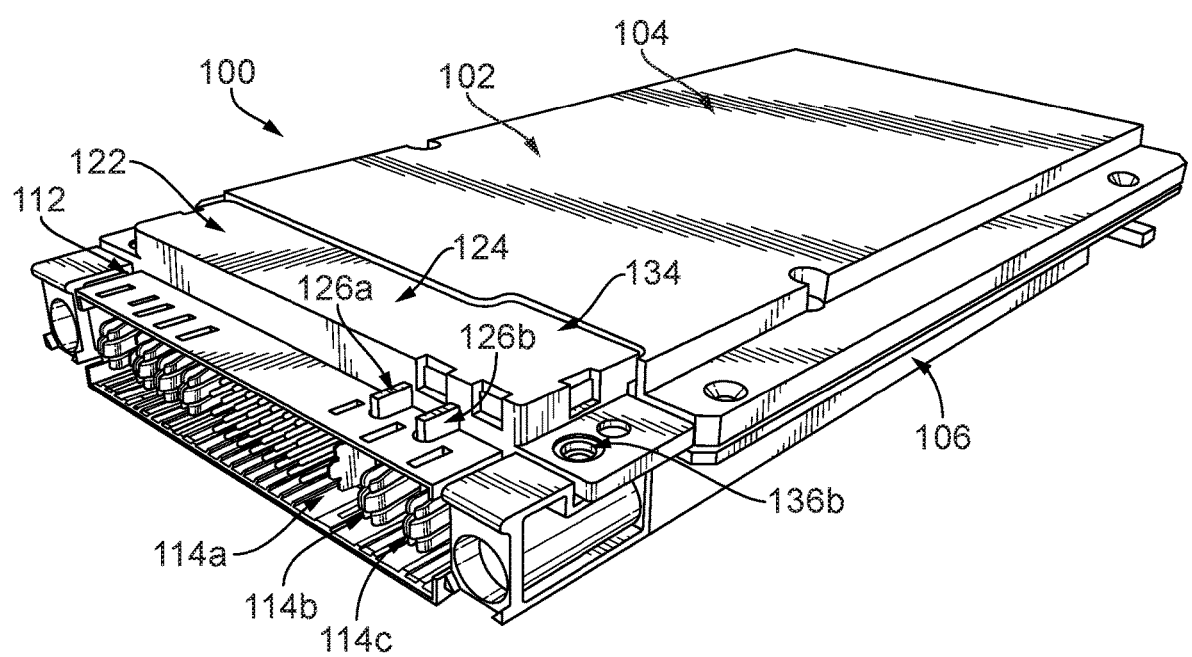
FIG. 1 is a first perspective illustration of an electronic module with the integrated insulator of the preferred embodiment.
Figure 2:
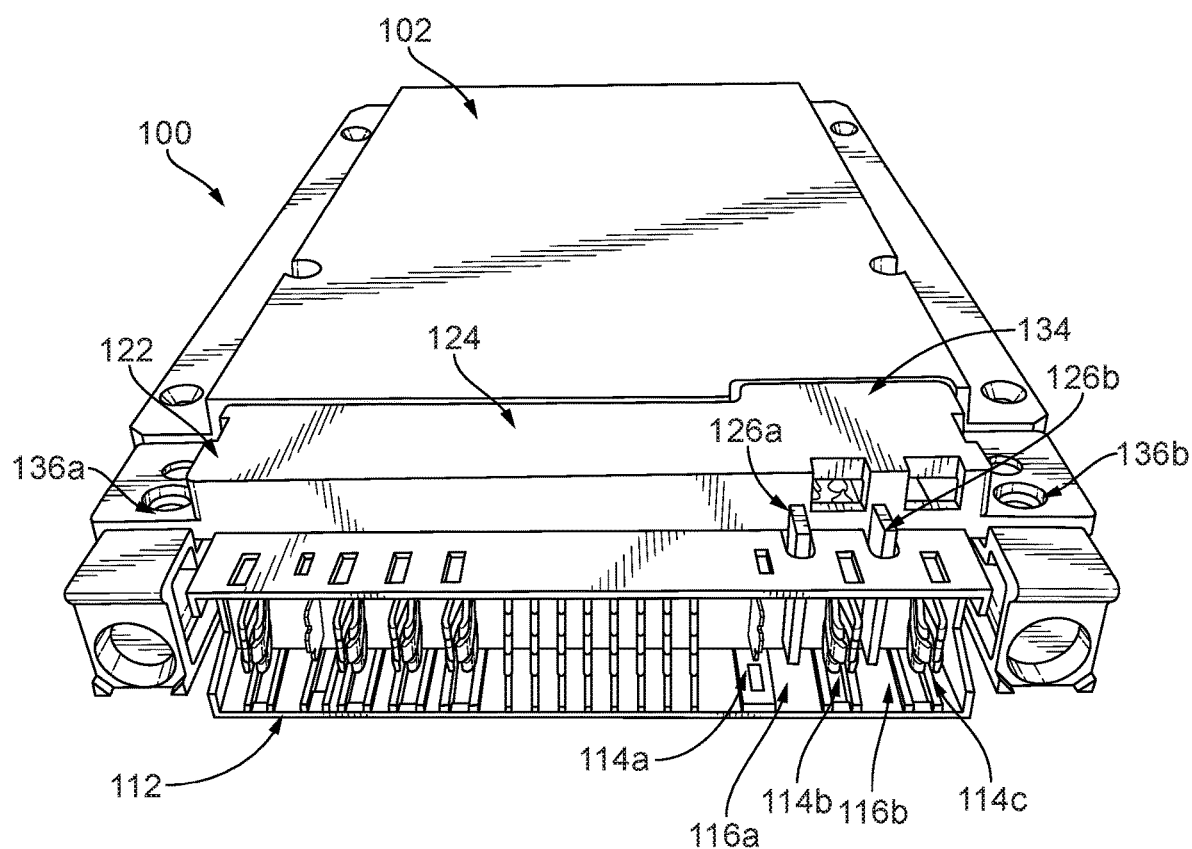
FIG. 2 is a second perspective illustration of an electronic module with the integrated insulator of the preferred embodiment.
Figure 3:
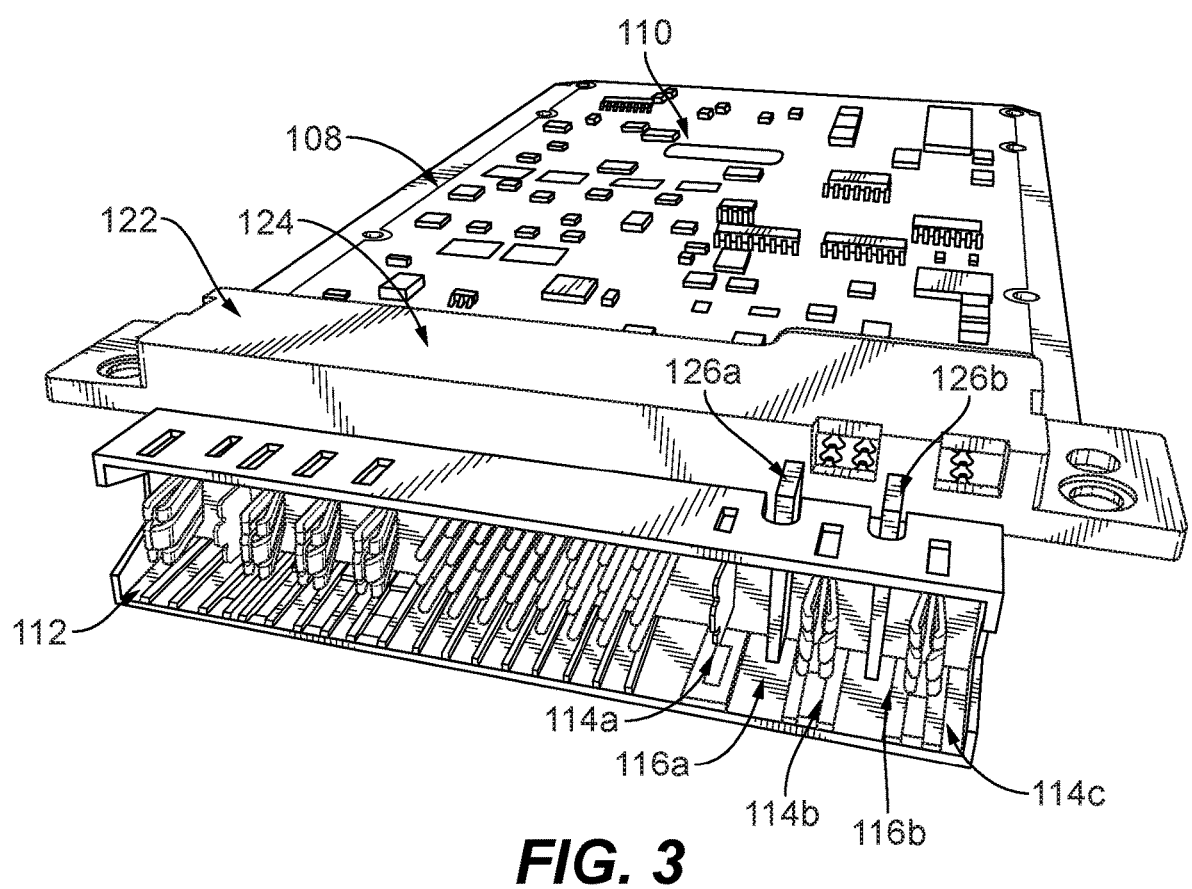
FIG. 3 is a perspective illustration of the electronic module of FIG. 1 with the integrated insulator of the preferred embodiment, omitting the housing.
Figure 4:
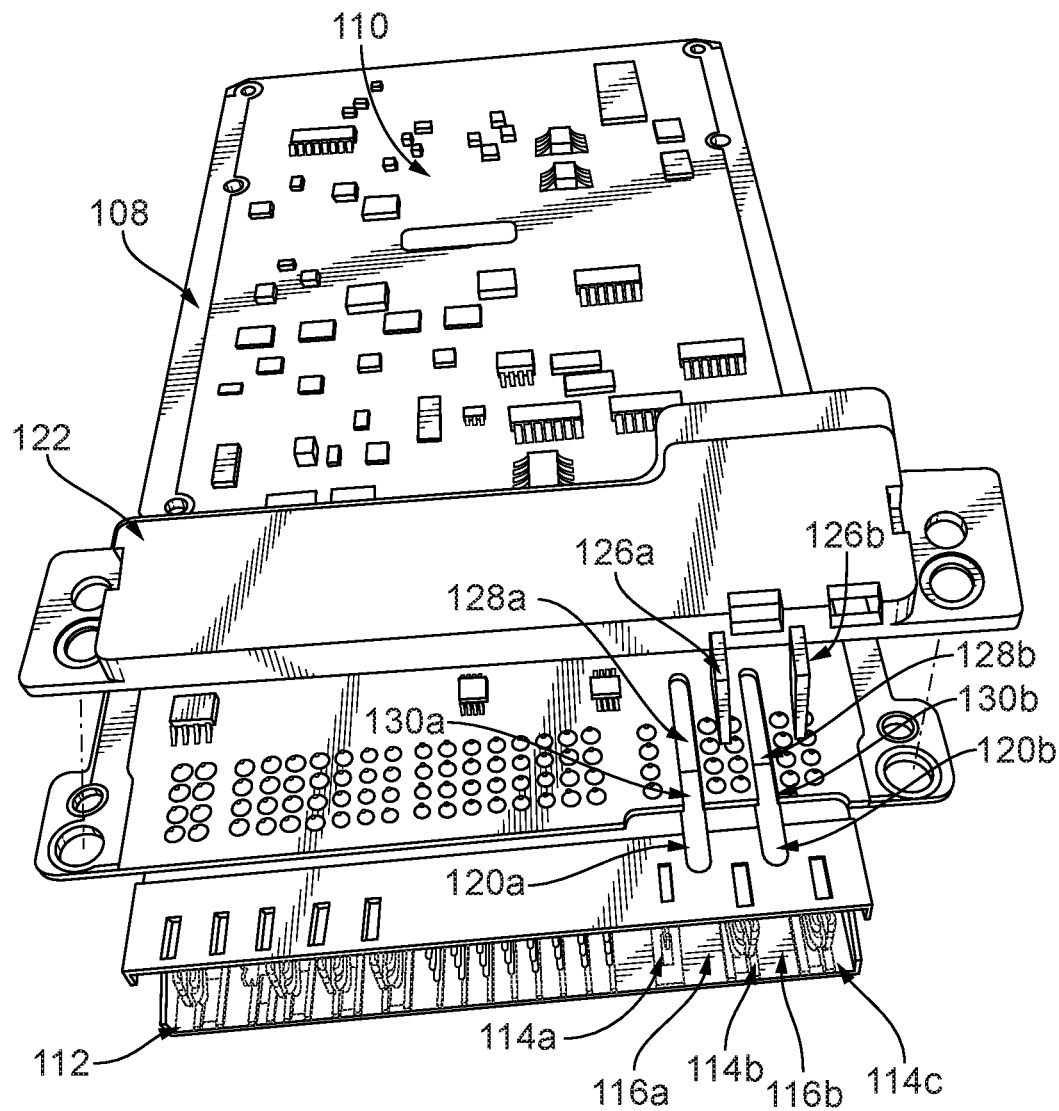
FIG. 4 is an exploded illustration of the integrated insulator and printed circuit board of the preferred embodiment.

FIGS. 1 and 2 are perspective illustrations of an electronic module with the integrated insulator of the preferred embodiment. Shown in FIGS. 1 and 2 is an electronic module 100, which may be for example a high voltage power supply module. The module 100 is comprised of several major components, including a housing 102, a module connector 112 (which is interconnected to a printed circuit board 108 residing within the housing 102, not shown here), and an integrated insulator 122. The housing 102 is comprised of a primary side cover 106 and a secondary side cover 104, which are adjoined and held together to form a cavity in which the PC board 108 resides, as well known in the art. FIGS. 3 and 4 illustrate the PC board 108, the module connector 112, and the integrated insulator 122.

Referring to FIG. 3 the integrated insulator 122 is engaged in proximity to the module connector 112. The module connector 112 is affixed to the printed circuit (PC) board 108 in order to transfer electrical signals between electrical circuitry 110 located on the board 108 and wiring/circuitry on an adjoining backplane when the module is plugged into the backplane (not shown for clarity) as well known in the art. The module connector 112 has a plurality of electrical contacts, in particular contacts 114a, 114b, and 114c (referred to generally as contact(s) 114). These three contacts 114 extend from the connector housing and are separated from each other by a pair of gaps 116a and 116b (referred to generally as gap(s) 116). As further shown in FIG. 4, the connector 112 has a pair of connector slots/cutouts 120a and 120b that are located over the gaps 116a, 116b, respectively.

The printed circuit board 108 additionally has a pair of board slots 128a, 128b located so as to align with the mating connector slots 120a, 120b when the connector 112 is affixed to the printed circuit board 108 as shown in FIG. 4 so as to form a pair of contiguous slots 130a, 130b.

Figure 5:
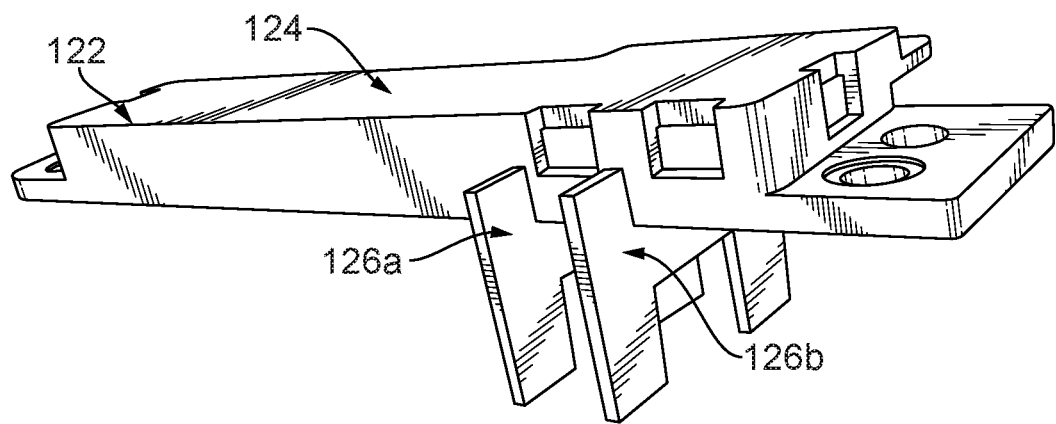
FIG. 5 is a perspective illustration of the integrated insulator of the preferred embodiment.

Shown in FIG. 5 is the integrated insulator 122 of the preferred embodiment of this invention. The integrated insulator 122 has a body 124 and a pair of fins/spacers 126a, 126b that extend downwardly from the body 124 as shown. Referring to FIG. 4, the fins 126 are disposed so as extend through the pair of contiguous slots 130, respectively, when the integrated insulator 122 is engaged with the module connector 112. As such, the fins 126 will reside in each of the gaps 116 between the adjacent contacts 114 when assembled as shown (see FIGS. 2 and 3).

The insulator 122 also has a pair of apertures 136a, 136b (shown in FIG. 2) which allow it to be affixed with screws or the like to the connector 112 and/or PC board 108, such that the fins 126 remain in the gaps 116 as an assembled product. After the insulator 122, connector 112 and PC board 108 have been assembled, then the housing 102 may be formed around this assembly by adjoining the primary side cover 106 and secondary side cover 104 around the top and bottom of the PC board 108 and screwing them together as known in the art. The finished electronic module is shown in FIGS. 1 and 2.

As may be seen from FIG. 1, the flange 134 of the insulator 122 extends and mates with the secondary side housing 104. In the prior art, the integrated insulator 122 is not present and the secondary side housing 104 extends over the PC board 108 to the module connector 112. The integrated insulator 122 may be fabricated from a plastic material. The insulator 122 may be formed from techniques such as 3D printing, injection molding, etc.

The preferred embodiment described herein implements three contacts separated by a pair of gaps into which a pair of fins are placed through associated slots so as to provide the increased effective creepage and clearance and reduce the deleterious effects of arcing at high altitudes for high voltage applications. The same advantages of this invention may also be achieved with a pair of contacts separated by a single gap into which a single fin is inserted in a similar manner. Likewise, more than three contacts may be implemented with a corresponding number of gaps and fins as may be desired while operating within the spirit and scope of this invention.

What is claimed is:

1. An electronic module comprising
   a housing;
   a printed circuit board comprising electrical circuitry and located substantially within the housing;
   a module connector affixed to the printed circuit board and comprising
      at least two contacts extending therefrom and separated from each other by a gap, each contact electrically connected to the electrical circuitry on the printed circuit board for interfacing the electrical circuitry with a backplane when the module is plugged into said backplane, and
      at least one connector slot disposed in the gap; and
   an integrated insulator engaged in proximity to the module connector, comprising
      a body adapted for placement in proximity to the module connector, and
      at least one fin extending from the body so as to extend through the connector slot on the module connector and reside in the gap when the integrated insulator is engaged with the module connector.

2. The module of claim 1 wherein
   the housing comprises a primary side cover and a secondary side cover, wherein when the primary side cover and the secondary side cover are adjoined together a cavity is formed so as to enclose substantially the printed circuit board.

3. The module of claim 1 wherein
   the printed circuit board further comprises at least one board slot disposed near the at least one connector slot when the module connector is affixed to the printed circuit board; and
   the at least one fin of the integrated insulator extends from the body so as to extend through the at least one board slot on the printed circuit board and the at least one connector slot on the module connector and reside in the gap when the integrated insulator is engaged with the module connector.

4. The module of claim 1 wherein the printed circuit board comprises power supply circuitry.

5. In combination, a module connector and integrated insulator, wherein
   the module connector comprises at least two contacts extending therefrom and separated from each other by a gap, and at least one connector slot disposed in the gap; and the integrated insulator comprises a body adapted for placement in proximity to the module connector, and at least one fin extending from the body so as to extend through the connector slot on the module connector and reside in the gap when the integrated insulator is engaged with the module connector.

6. An integrated insulator comprising a body adapted for placement in proximity to a module connector, and at least one fin extending from the body so as to extend through a connector slot on the module connector and reside in a gap between a pair of contacts when the integrated insulator is engaged with the module connector.

7. A power supply module comprising a housing comprising a primary side cover and a secondary side cover, wherein when the primary side cover and the secondary side cover are adjoined together a cavity is formed;

a printed circuit board comprising power supply circuitry and located substantially within the cavity in the housing;

a module connector affixed to the printed circuit board and comprising three contacts extending therefrom and separated from each other by a first gap and a second gap, each contact electrically connected to the electrical circuitry on the printed circuit board for interfacing the electrical circuitry with a backplane when the module is plugged into said backplane, and a first connector slot disposed in the first gap and a second connector slot disposed in the second gap; and wherein the printed circuit board further comprises a first board slot disposed near the first connector slot and a second board slot disposed near the second connector slot when the module connector is affixed to the printed circuit board;

the module further comprising an integrated insulator engaged in proximity to the module connector, comprising a body adapted for placement in proximity to the module connector, a first fin feature extending from the body and extending through the first connector slot on the module connector and the first board slot so as to reside in the first gap when the integrated insulator is engaged with the module connector, and a second fin extending from the body and extending through the second connector slot on the module connector and the second board slot so as to reside in the second gap when the integrated insulator is engaged with the module connector.

* * * * *